(12) United States Patent
Farrow et al.

(10) Patent No.: US 7,200,006 B2
(45) Date of Patent: Apr. 3, 2007

(54) COMPLIANT THERMAL INTERFACE FOR ELECTRONIC EQUIPMENT

(75) Inventors: Timothy Samuel Farrow, Apex, NC (US); Albert Vincent Makley, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 10/860,683

(22) Filed: Jun. 3, 2004

(65) Prior Publication Data

US 2005/0270744 A1    Dec. 8, 2005

(51) Int. Cl.
*H05K 7/20* (2006.01)
*H01L 23/373* (2006.01)

(52) U.S. Cl. ............... 361/704; 361/710; 257/717
(58) Field of Classification Search ........... 361/704, 361/710; 257/717
See application file for complete search history.

(56) References Cited

U.S. PATENT DOCUMENTS

| | | | | |
|---|---|---|---|---|
| 2,221,310 A | * | 11/1940 | Gazelle | 428/158 |
| 3,940,811 A | * | 3/1976 | Tomikawa et al. | 5/740 |
| 4,151,547 A | * | 4/1979 | Rhoades et al. | 257/718 |
| 4,654,754 A | * | 3/1987 | Daszkowski | 361/708 |
| 5,438,477 A | * | 8/1995 | Pasch | 361/689 |
| 5,548,090 A | * | 8/1996 | Harris | 174/252 |
| 6,131,646 A | * | 10/2000 | Kelley | 165/80.1 |
| 6,241,005 B1 | * | 6/2001 | Risca | 165/46 |
| 6,245,186 B1 | * | 6/2001 | Alcoe et al. | 156/300 |
| 6,411,513 B1 | * | 6/2002 | Bedard | 361/704 |
| 6,926,947 B1 | * | 8/2005 | Seckel | 428/174 |
| 2002/0015288 A1 | * | 2/2002 | Dibene et al. | 361/711 |

* cited by examiner

*Primary Examiner*—Anatoly Vortman
(74) *Attorney, Agent, or Firm*—Cynthia S. Byrd; Dillon & Yudell LLP

(57) ABSTRACT

A thin metallic sheet having an array of alternating domes, directed away from opposite sides of the sheet, to bridge a gap between a top surface of a processor package and a bottom surface of a heat sink. The sheet is positioned between the processor package and heat sink before securing the heat sink to the processor package. By pressing the processor package and heat sink together, the tops of the domes flatten out to maximize surface contact between a first side of the sheet and the top of the processor package, and between a second side of the sheet and the top of the heat sink.

20 Claims, 7 Drawing Sheets

COMPLIANT THERMAL INTERFACE FOR ELECTRONIC EQUIPMENT

BACKGROUND OF THE INVENTION

1. Technical Field

The present invention relates in general to the field of electronics, and in particular to electronic chips that generate extraneous heat during normal operation. More particularly, the present invention relates to a method and system for conducting heat away from an integrated circuit, which still more particularly may be a microprocessor.

2. Description of the Related Art

In a typical personal computer (PC), the main heat-generating component among the logic circuits is the processor, also referred to as the Central Processing Unit (CPU) or microprocessor (MP). As illustrated in FIG. 1, a processor 102 is mounted in a socket 104, which is mounted on a (printed) circuit board 106 by mating pins 108 from the processor 102 into the socket 104. As processors continue to grow in performance, so does the heat generated by the processors. To remove heat from processor 102, a heat sink (HS) 110, having a HS base 112 and a plurality of fins 114, is secured to processor 102 by a strap 116. Heat is conducted from the processor 102 to the HS base 112 and the fins 114, which dissipate heat by conduction and convection to ambient air surrounding fins 114.

There are two main thermal resistances to heat that is to be dissipated away from processor 102. The first of these two resistances is caused by the interface between processor 102 and HS base 112, and is referred to as "R Case to HS," which describes the heat transfer resistance between the case of the processor 102 and the HS 110. The second resistance, known as "R HS to air," is the internal heat transfer resistance of the HS 110 itself, including the material resistance of HS base 112 and fins 114 as well as the heat transfer resistance of the interface between HS 110 and ambient air, especially the air proximate to fins 114.

The temperature differential between processor 102 and an ambient environment, such as air, is called ΔT. For example, if the operating temperature of processor 102 is 75° C., and the ambient temperature around heat sink 110 is 35° C., then ΔT=75° C.−35° C.=40° C.

Heat resistance is properly the inverse of thermal conductivity, which is usually defined as watts per meter-Kelvin, thus resulting in thermal resistance as being meters-Kelvin per watt. However, by convention, heat resistance in electronics is typically defined as ΔT per watt of power generated by the electronic device. Expressed as a formula, then, where ΔT is the difference in the temperature (in Celsius) between the processor and the ambient air, P is the wattage of the processor, and R is the thermal resistance to heat being transferred away from the processor, then:

$$R = \frac{\Delta T}{P}$$

with R generally expressed in units of "degrees C/W" (temperature difference in degrees Celsius per Watt of energy).

In modern computers, the interface resistance between processor 102 and the bottom of HS base 110 ("R Case to HS") accounts for over half of the total heat transfer resistance. Since air is a very poor conductor of heat, the most effective type of heat transfer from processor 102 to HS base 112 is by heat conduction via contacting surfaces of the bottom of HS base 112 and the top of processor 102. However, minor warping, pits and other features of both these surfaces result in only 1% to 5% of the surfaces actually being in contact. To address this lack of direct physical contact, several approaches have been taken in the past. One approach is to lap and polish the surfaces, but this is time consuming and usually cost prohibitive. Another approach is to use a contact interface, such as a grease 118, which is usually a thermally conducting silicon or filled hydrocarbon grease that conducts heat from processor 102 to HS 110. However, grease 118 is messy and difficult to replace in the field, and fillings, such as metals, used to increase thermal conduction are expensive. Other materials have been suggested to replace grease 118, including graphite material such as Union Carbide's GRAFOIL™, but with only limited improvement over the use of grease 118.

What is needed therefore, is a device that reduces interface thermal resistance between two imperfectly flat surfaces by promoting direct physical contact between the two surfaces, such as the top of processor 102 and the bottom of HS base 112.

SUMMARY OF THE INVENTION

The present invention is directed to a thin metallic sheet having an array of alternating domes, directed away from opposite sides of the sheet, to bridge a gap between a top surface of a processor package and a bottom surface of a heat sink. The sheet is positioned between the processor package and heat sink before securing the heat sink to the processor package. By pressing the processor package and heat sink together, the tops of the domes flatten out to maximize surface contact between a first side of the sheet and the top of the processor package, and between a second side of the sheet and the top of the heat sink.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIG. 2b depicts a side-view of the sheet illustrated in FIG. 2a;

DETAILED DESCRIPTION OF A PREFERRED EMBODIMENT

Figure 1:
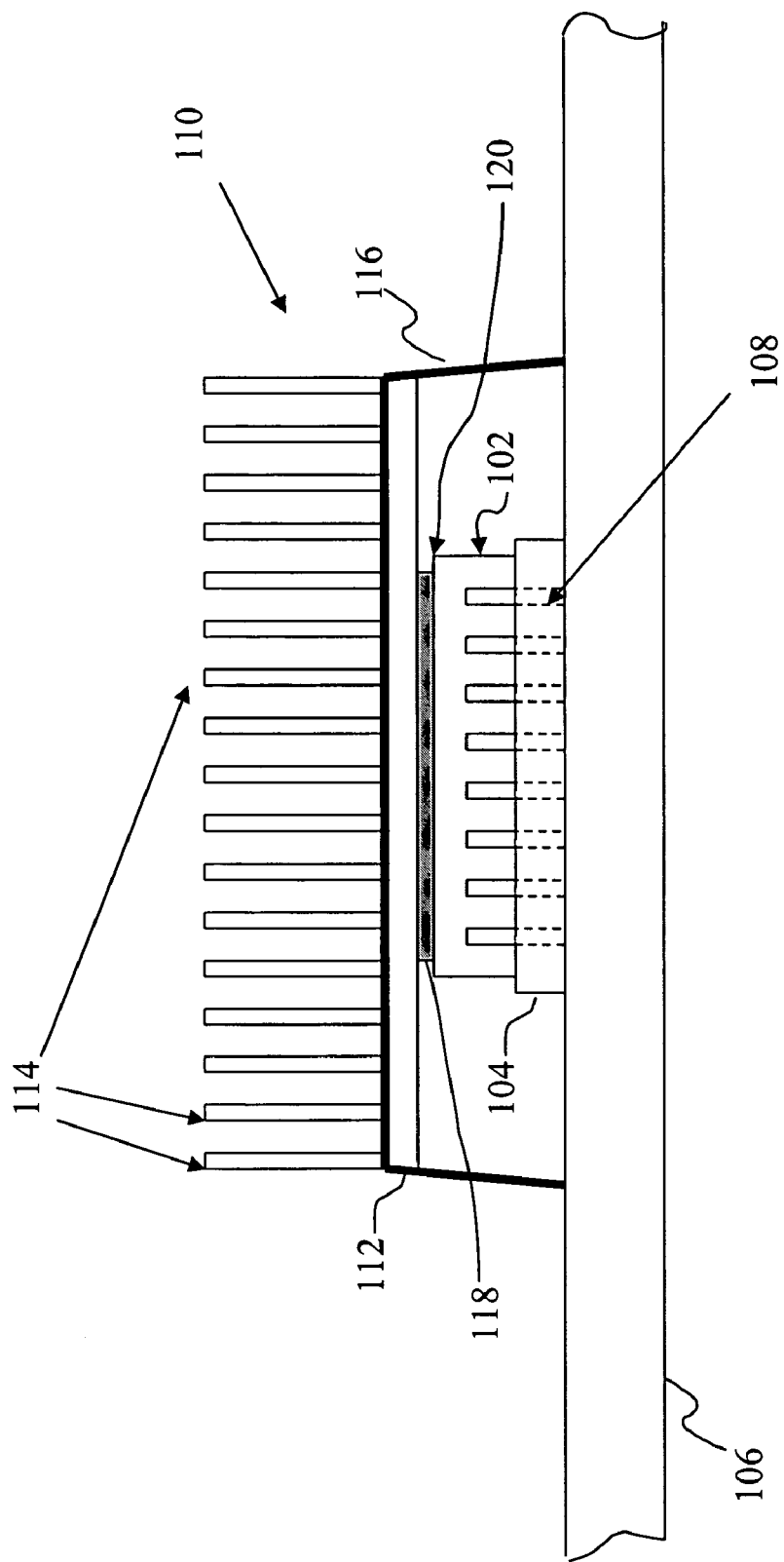
FIG. 1 depicts a prior art mounting of a processor using a thermal grease for conducting heat from the processor to a heat sink.
Figure 2A:
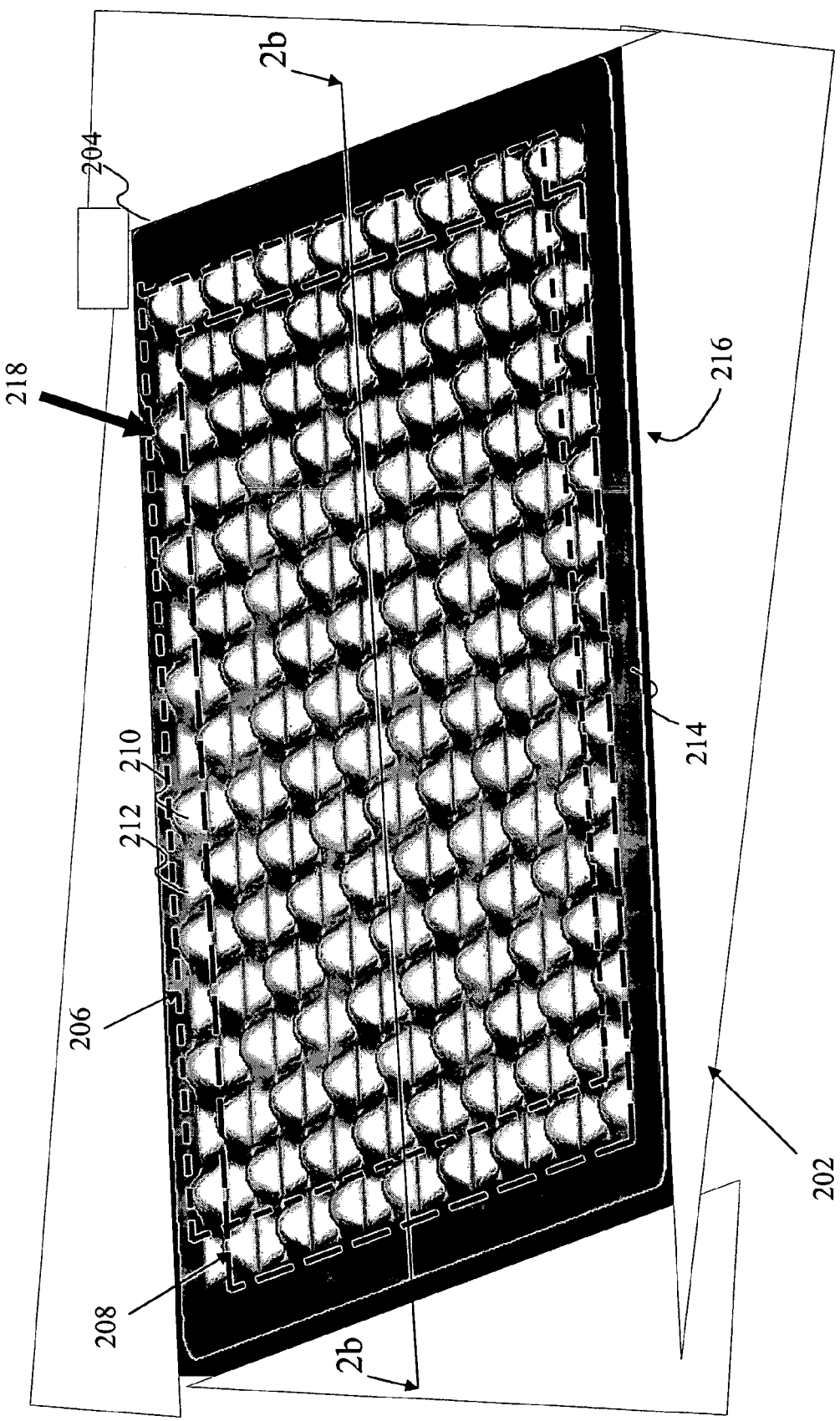
FIG. 2a illustrates an inventive thin metal sheet of alternating domes for maximizing contact between two imperfectly flat surfaces.

With reference now to FIG. 2a, there is depicted a thermal interface 202 as contemplated by the present invention. Thermal interface 202 is formed from a malleable sheet 204. Preferably, malleable sheet 204 has a same dimension as a top of a case 120 of processor 102 illustrated in FIG. 1. One such preferred dimension is 38 millimeters by 38 millimeters.

Formed on malleable sheet 204 are multiple domes, preferably a first array of domes 206 and a second array of domes 208. First array of domes 206 and second array of domes 208 are offset to one another as depicted. In the exemplary depiction of FIG. 2, first array of domes 206 is a dual 8×8 array of 64 up domes 210 and 64 down domes 212. Similarly, second array of domes 208 is an offset dual 8×8 array of 64 up domes 210 and 64 down domes 212. During fabrication of thermal interface 202, up domes 210 are pressed through and away from a first side 214 of malleable sheet 204, and down domes 212 are pressed through and away from a second side 216. These patterns of up and down domes can be fabricated using any method known to those skilled in the art, including pressing, punching and otherwise forming with or without heat, depending on the material of which malleable sheet 204 is composed.

Figure 2B:
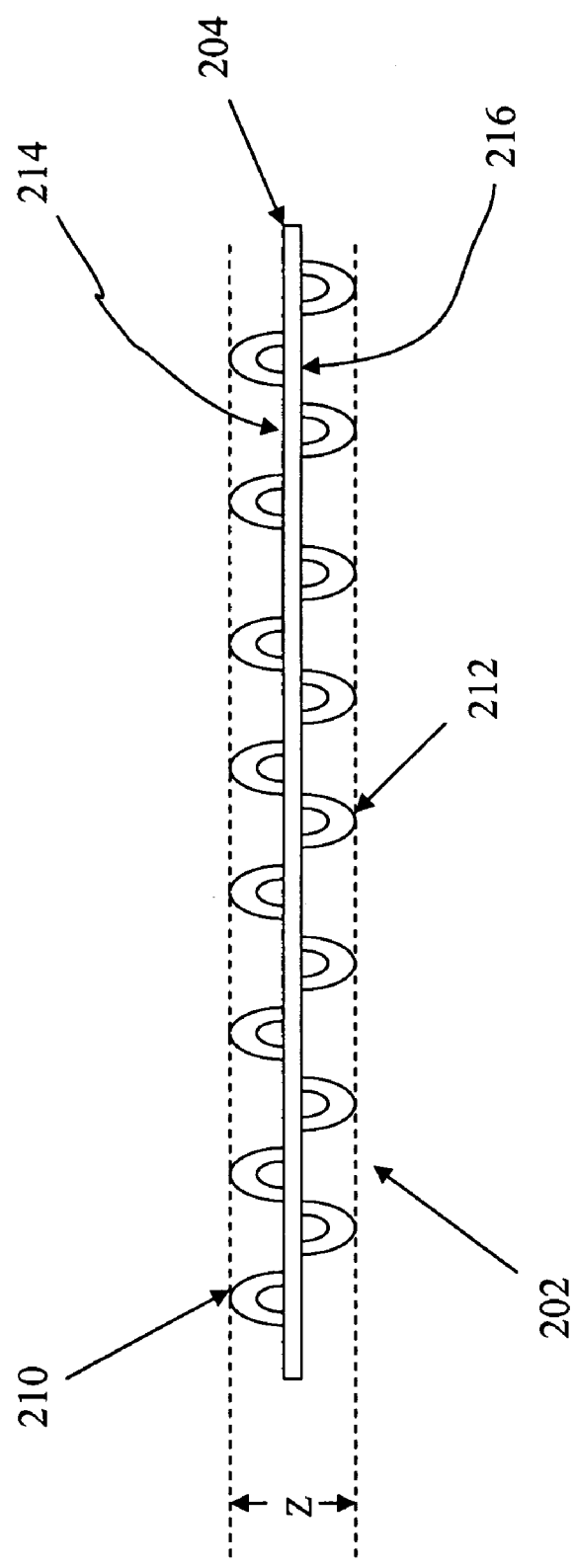

Referring now to FIG. 2b, there is illustrated a cross-sectional view of thermal interface 202, as defined by section line "2b" shown in FIG. 2a. As shown, up domes 210 and down domes 212 extend away from the original plane of malleable sheet 204. In a preferred embodiment, a peak-to-peak distance "Z" from the apexes of up domes 210 to the apexes of down domes 212 is between 1.6 millimeters and 2.0 millimeters, most preferably 1.8 millimeters.

Referring again to FIG. 2a, each dome has a dome top 218, which, when compressed in a manner described below, will crush or flatten to be depressed between 0.2 and 0.4 millimeters. This flattening results in a much higher percentage of direct material contact (>10%) as compared to that achieved by two ordinary flat surfaces (1 to 5%). That is, flattening dome tops 218 results in an extensive array of flattening surfaces that conform to an imperfectly flat planed sheet being pressed against the dome tops 218. To facilitate this flattening, dome tops 218 are thinner that the rest of the dome. In a preferred embodiment, dome tops 218, defined as the top (closest to the apex) 20% to 50% of each dome, are 20% to 30% thinner than the rest of the dome, if the malleable sheet 204 is made of nominally pure copper, being at least 99.95% pure copper. For materials other than copper, the dome tops 218 are adjusted in their degree of thinness according to the crushability of the material used.

Figure 3:
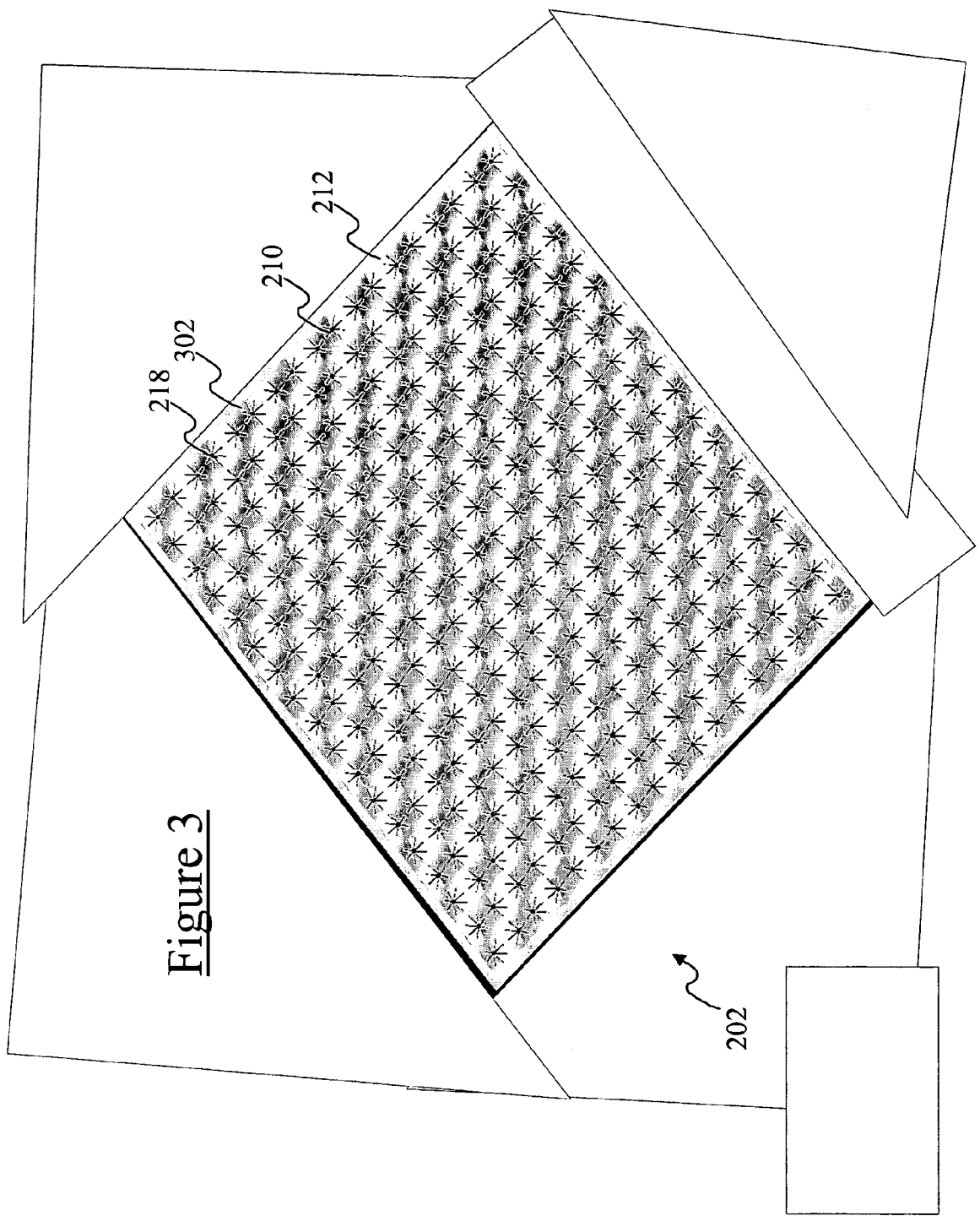
FIG. 3 illustrates an alternate preferred embodiment of the inventive thin metal sheet having slit dome tops.

With reference now to FIG. 3, there is depicted an alternate preferred embodiment of thermal interface 202. As illustrated, each dome top 218, of both up domes 210 and down domes 212, has at least one slit 302. Alternatively, slits 302 are on only the dome tops 218 of up domes 210 or down domes 212 or a portion of domes 208. That is, while all up domes 210 and down domes 212 are depicted as having multiple slits 302, in an alternate preferred embodiment, only a portion of the up domes 210 and/or down domes 212 have slits 302. As depicted, a preferred embodiment of the dome tops 218 has eight radially extending slits 302. Alternately, each slit dome top may have more or less than eight slits 302. The slits may either extend completely through dome top 218, or may be only a etch that does not extend completely through dome top 218. The purpose of slits 302 is the same as the thinning of dome tops 218 described above, which is to make dome tops 218 more malleable when crushed to promote more thorough flattening for better contact with a flat surface.

Figure 4A:
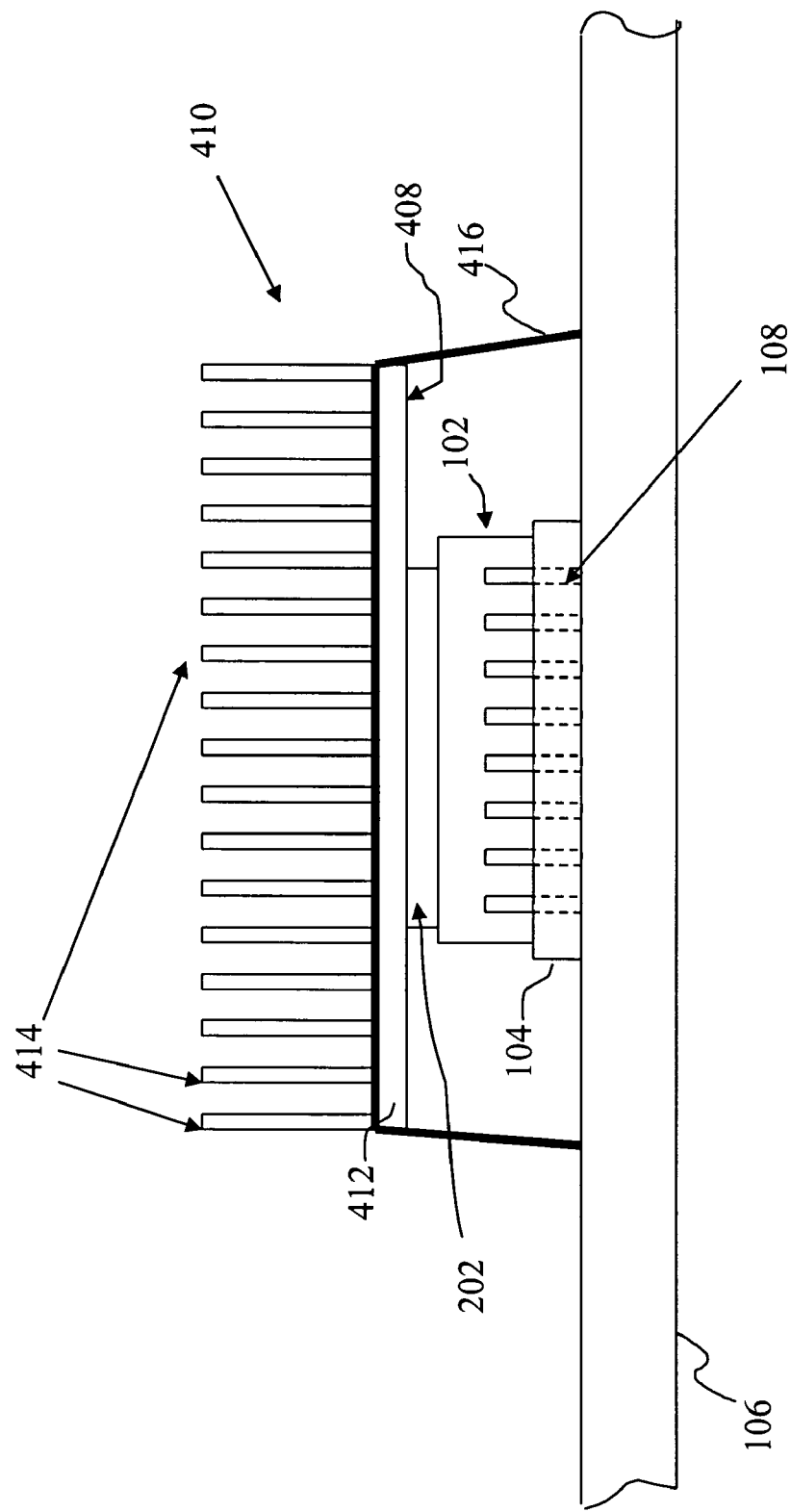
FIGS. 4a–b illustrate the inventive thin metal sheet being positioned between a processor and a heat sink.

Referring now to FIG. 4a, there is illustrated a side view of processor 102 being mounted in socket 104, which is mounted to circuit board 106. Processor 102 mates with socket 104 using any type of connection method, including but not limited to pins 108, as described in FIG. 1, or any other type of connection known to those skilled in the art, including solder balls, connectors, etc. Alternatively, processor 102 can be directly mounted (usually by soldering) to circuit board 106.

As shown in FIG. 4a, instead of using grease 118 to provide a thermal interface between processor 102 (and particularly the top of the case 120 of processor 102 as depicted in FIG. 1) and a heat sink (HS) 410, the present invention uses thermal interface 202, which is described above in reference to FIGS. 2a et seq., to provide such a thermal interface. Heat sink (HS) 410, having fins 414 and an HS base 412, is compressed against processor 102 using a strap 416.

Figure 4B:
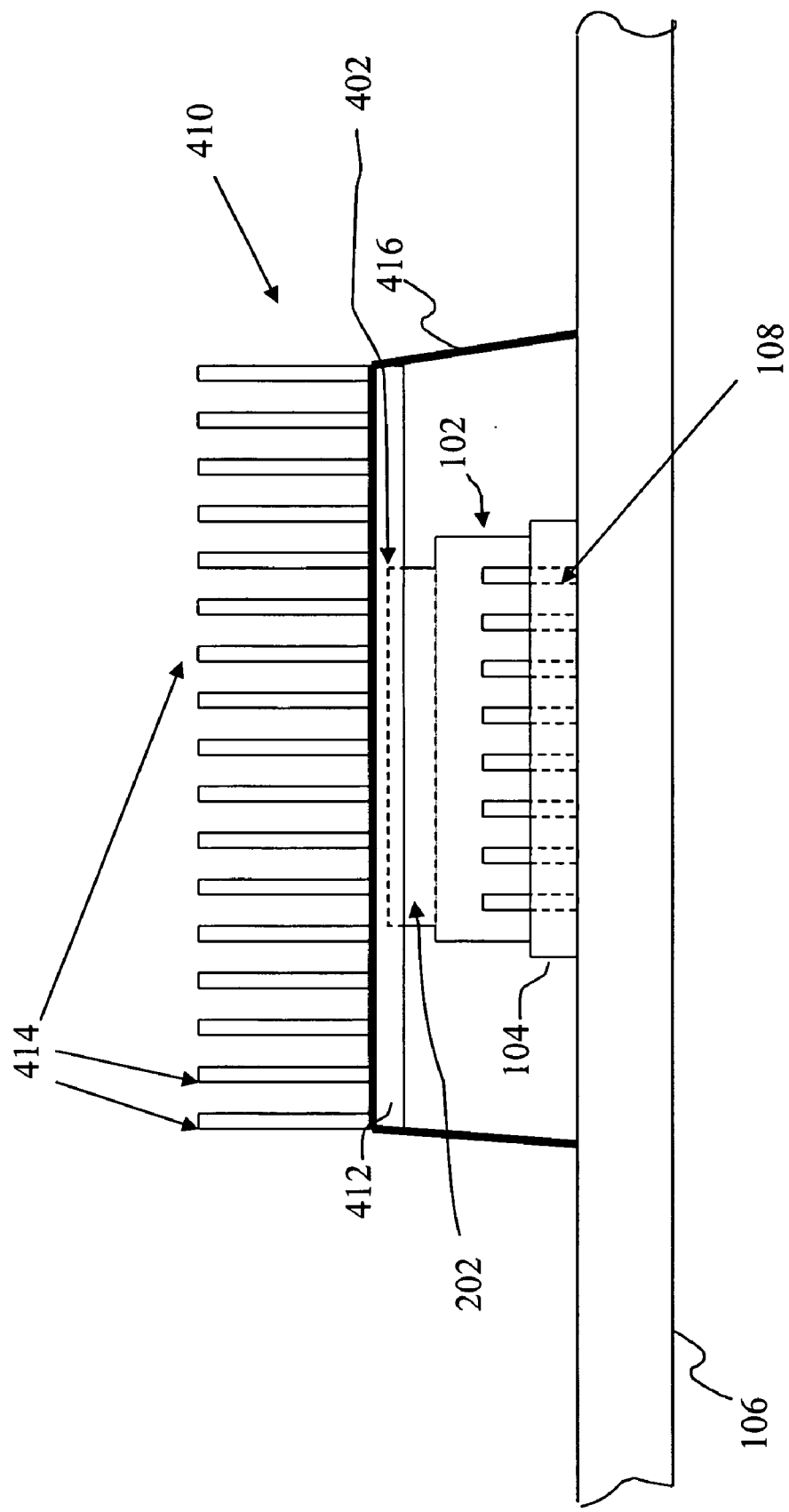

In an alternate preferred embodiment depicted in FIG. 4b, HS base 412 has a cavity 402, in which thermal interface 202 seats to prevent lateral movement when HS 410 is compressed against processor 102. As shown in the embodiment depicted in FIG. 4a, HS base 412 has no cavity 402, allowing thermal interface 202 to compress against a bottom surface 408 of HS base 412. In either embodiment (with or without cavity 402), the compressive load between HS 410 and processor 102 is preferably between 25 and 50 psi (pounds per square inch), to provide appropriate flattening/crushing of dome tops 218, depicted in FIG. 2a.

Figure 5:
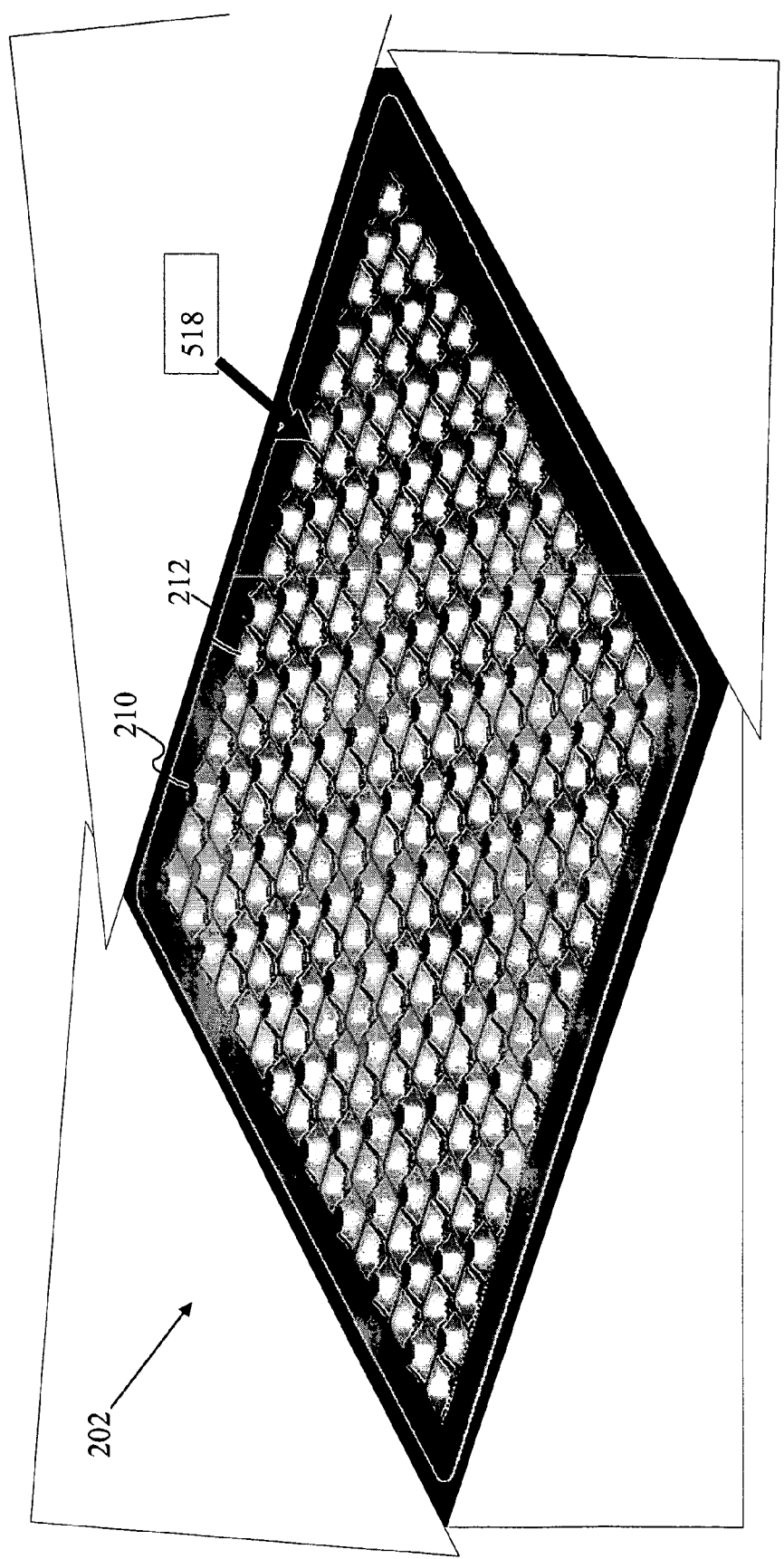
FIG. 5 depicts the inventive thin metal sheet after being crushed between the processor and the heat sink as shown in FIG. 4a or FIG. 4b.

Referring then to FIG. 5, crushed dome tops 518 are depicted showing their relatively flat surfaces compared to uncrushed dome tops 218 shown in FIG. 2a. While the crushed dome tops 518 are shown for up domes 210, it is understood that down domes 212 are preferably similarly crushed during compression between HS 410 and processor 102.

While the invention has been particularly shown and described with reference to a preferred embodiment, it will be understood by those skilled in the art that various changes in form and detail may be made therein without departing from the spirit and scope of the invention. For example, thermal interface 202 has been depicted and described as having two offset arrays of domes, with each array being an 8×8 array of up domes and an 8×8 array of down domes. Alternatively, any array size, preferably of uniform sides (12×12, 14×14, etc.) may be used in conformance with the present invention's spirit. Similarly, while thermal interface 202 has been described as preferably being the same as a top of processor 102 (e.g., 38 millimeters by 38 millimeters), any sized dimension may be used as appropriate for the application. That is, the dimensions may be adjusted to conform with a flat surface of any electronic or other heat generating device, including but not limited to controllers, transformers, memory chips, etc. Furthermore, while thermal interface 202 has been described as providing an interface between processor 102 and heat sink 410, thermal interface 202 may be used as a thermal interface between any two relatively flat surfaces, in which heat needs to be conducted from one of the relatively flat surfaces to the other relatively flat surface. Further still, while thermal interface 202 has been described as a metallic sheet, any material having sufficient thermal conductivity properties as well as crushable dome tops may be used to construct thermal interface 202. Examples of such materials include, but are not limited to, composite layer materials, nanomaterials such as nano-carbon fibers, and other similar materials.

What is claimed is:

1. A thermal interface comprising:
   a malleable sheet;
   a first array of hollow domes extending away from a first side of the malleable sheet; and
   a second array of hollow domes extending away from a second side of the malleable sheet, wherein the first array of hollow domes is offset to the second array of hollow domes, and wherein the malleable sheet is oriented between an electronic device and a heat sink to facilitate a transfer of heat from the electronic device to the heat sink when the thermal interface is compressed between the electronic device and the heat sink.

2. The thermal interface of claim 1, wherein the malleable sheet is made of a compliant metal, such that the first and second arrays of hollow domes conform to irregularities between a contact surface of the electronic device and a contact surface of the heat sink when the thermal interface is compressed between the electronic device and the heat sink.

3. The thermal interface of claim 2, wherein the compliant metal is copper.

4. The thermal interface of claim 2, wherein the thermal interface is sandwiched between the electronic device and the heat sink in a cavity in the heat sink, such that an adhesive is not used to secure the thermal interface to the heat sink or the electronic device.

5. The thermal interface of claim 1, wherein a dome top of each dome in the first and second arrays of hollow domes is thinner than the rest of the dome, such that the dome top is more malleable when crushed than the rest of the dome in order to provide greater surface contact between the thermal interface and the electronic device or the heat sink.

6. The thermal interface of claim 1, wherein a dome top of each dome in the first and second arrays of hollow domes includes at least one slit, such that the dome top is more malleable when crushed than the rest of the dome in order to provide greater surface contact between the thermal interface and the electronic device or heat sink.

7. The thermal interface of claim 1, wherein the electronic device is a microprocessor mounted on a circuit board.

8. The thermal interface of claim 1, wherein a peak-to-peak distance from an apex of an up dome in the first array of hollow domes is between 1.6 millimeters and 2.0 millimeters to an apex of a down dome in the second array of hollow domes.

9. The thermal interface of claim 6, wherein the at least one slit extends completely through the dome top.

10. A method comprising:
    positioning a malleable sheet between an electronic device and a heat sink, the malleable sheet including:
    a first array of hollow domes extending away from a first side of the sheet; and
    a second array of hollow domes extending away from a second side of the sheet, wherein the first array of domes is offset to the second array of hollow domes, and wherein the malleable sheet is oriented between an electronic device and a heat sink to facilitate a transfer of heat from the electronic device to the heat sink when the malleable sheet is compressed between the electronic device and the heat sink.

11. The method of claim 10, wherein the malleable sheet is made of a compliant metal, such that the first and second arrays of hollow domes conform to irregularities between a contact surface of the electronic device and a contact surface of the heat sink when the malleable sheet is compressed between the electronic device and the heat sink.

12. The method of claim 10, wherein the thermal interface is sandwiched between the electronic device and the heat sink in a cavity in the heat sink, such that an adhesive is not used to secure the thermal interface to the heat sink or the electronic device.

13. The method of claim 10, wherein a dome top of each dome in the first and second arrays of hollow domes is thinner than the rest of the dome, such that the dome top is more prone to being flattened than the rest of the dome in order to provide greater surface contact between the thermal interface and the electronic device or the heat sink when the malleable sheet is compressed between the electronic device and the heat sink.

14. The method of claim 10, further comprising a plurality of radially extending slits in a dome top of at least one dome from the first and second arrays of domes, wherein the plurality of radially extending slits makes the dome top more malleable when crushed to promote more thorough flattening for better contact with a flat surface.

15. The method of claim 10, wherein the electronic device is a microprocessor mounted on a circuit board.

16. The method of claim 14, wherein the plurality of radially extending slits are in all dome tops of domes in the first and second arrays of domes, and wherein the plurality of radially extending slits extend completely through the dome tops.

17. A compliant sheet comprising:
    a first array of domes extending away from a first side of the sheet;
    a second array of domes extending away from a second side of the sheet, wherein the first array of domes is offset to the second array of domes; and
    a plurality of radially extending slits in a dome top of at least one dome from the first and second arrays of domes, wherein the plurality of radially extending slits makes the dome top more malleable when crushed to promote more thorough flattening for better contact with a flat surface.

18. The compliant sheet of claim 17, wherein the compliant sheet is made of a malleable metal.

19. The compliant sheet of claim 16, wherein the plurality of radially extending slits are slits that traverse completely though the dome tops.

20. The compliant sheet of claim 18, wherein the compliant sheet is a thermal interface that is mounted between an electronic device and a heat sink.

* * * * *